(12) United States Patent
Kennedy

(10) Patent No.: US 7,544,624 B2
(45) Date of Patent: Jun. 9, 2009

(54) SYSTEMS AND METHODS FOR PROCESSING MICROFEATURE WORKPIECES

(75) Inventor: Timothy James Kennedy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/619,130

(22) Filed: Jan. 2, 2007

(65) Prior Publication Data

US 2007/0102400 A1  May 10, 2007

Related U.S. Application Data

(62) Division of application No. 10/922,024, filed on Aug. 19, 2004.

(51) Int. Cl.
*H01L 21/302* (2006.01)
(52) U.S. Cl. .......................... 438/745; 216/83
(58) Field of Classification Search ............. 438/745, 438/747, 753, 756; 216/83
See application file for complete search history.

(56) References Cited

U.S. PATENT DOCUMENTS

| 5,327,921 | A | | 7/1994 | Mokuo et al. | |
|---|---|---|---|---|---|
| 5,482,068 | A | * | 1/1996 | Kitahara et al. | 134/182 |
| 5,921,257 | A | * | 7/1999 | Weber et al. | 134/186 |
| 6,189,552 | B1 | | 2/2001 | Oshinowo | |
| 6,270,585 | B1 | | 8/2001 | Schonleber | |
| 6,352,084 | B1 | * | 3/2002 | Oshinowo | 134/182 |
| 6,523,552 | B2 | | 2/2003 | Pokorny | |
| 6,969,419 | B1 | * | 11/2005 | Macemon | 95/241 |
| 2002/0096196 | A1 | * | 7/2002 | Toshima et al. | 134/21 |
| 2003/0034056 | A1 | * | 2/2003 | Amai et al. | 134/93 |
| 2003/0121537 | A1 | | 7/2003 | Dunn | |
| 2003/0188765 | A1 | | 10/2003 | Christenson et al. | |
| 2006/0037698 | A1 | | 2/2006 | Kennedy | |
| 2007/0113977 | A1 | * | 5/2007 | Hongo et al. | 156/345.31 |

* cited by examiner

*Primary Examiner*—Kin-Chan Chen
(74) *Attorney, Agent, or Firm*—Perkins Coie LLP (57) ABSTRACT

Systems and methods for processing microfeature workpieces are disclosed herein. In one embodiment, the system comprises a processing chamber having a workpiece processing site configured to receive a microfeature workpiece and a main inlet through which a processing fluid can flow into the processing chamber. The system further comprises a plate in the processing chamber between the main inlet and the workpiece processing site. The plate has a first side generally facing the main inlet and a second side opposite the first side. The plate further includes a plurality of passageways extending from the first side of the plate to the second side. The individual passageways include an inlet portion projecting from the first side of the plate by a separation distance.

19 Claims, 5 Drawing Sheets

SYSTEMS AND METHODS FOR PROCESSING MICROFEATURE WORKPIECES

CROSS-REFERENCE TO RELATED APPLICATION

This application is a divisional of U.S. patent application Ser. No. 10/922,024, filed Aug. 19, 2004, which is incorporated herein by reference in its entirety.

TECHNICAL FIELD

This application relates to systems and methods for processing microfeature workpieces.

BACKGROUND

Microfeature devices, such as semiconductor devices, imagers and displays, are generally manufactured on and/or in microfeature workpieces. A variety of chemical processes are used to manufacture and analyze (e.g., quality control testing) the microfeature devices. As feature sizes decrease and performance increases, it is becoming ever more important to control the composition of the materials. As such, microfeature workpieces are highly sensitive to variations or contamination during such chemical processes.

Etching is one common chemical process that is used in manufacturing operations. In a typical application, a workpiece may be etched to form vias, pattern a blanket conductive layer to form conductive lines, or form other structures on the workpiece. There are generally two types of etching processes—"dry" etching and "wet" etching. Most dry etching operations use a high-energy plasma that selectively removes portions of the microfeature workpiece. Wet etching processes generally immerse the workpiece in a tank that contains a liquid etching solution (i.e., an etchant).

Figure 1:
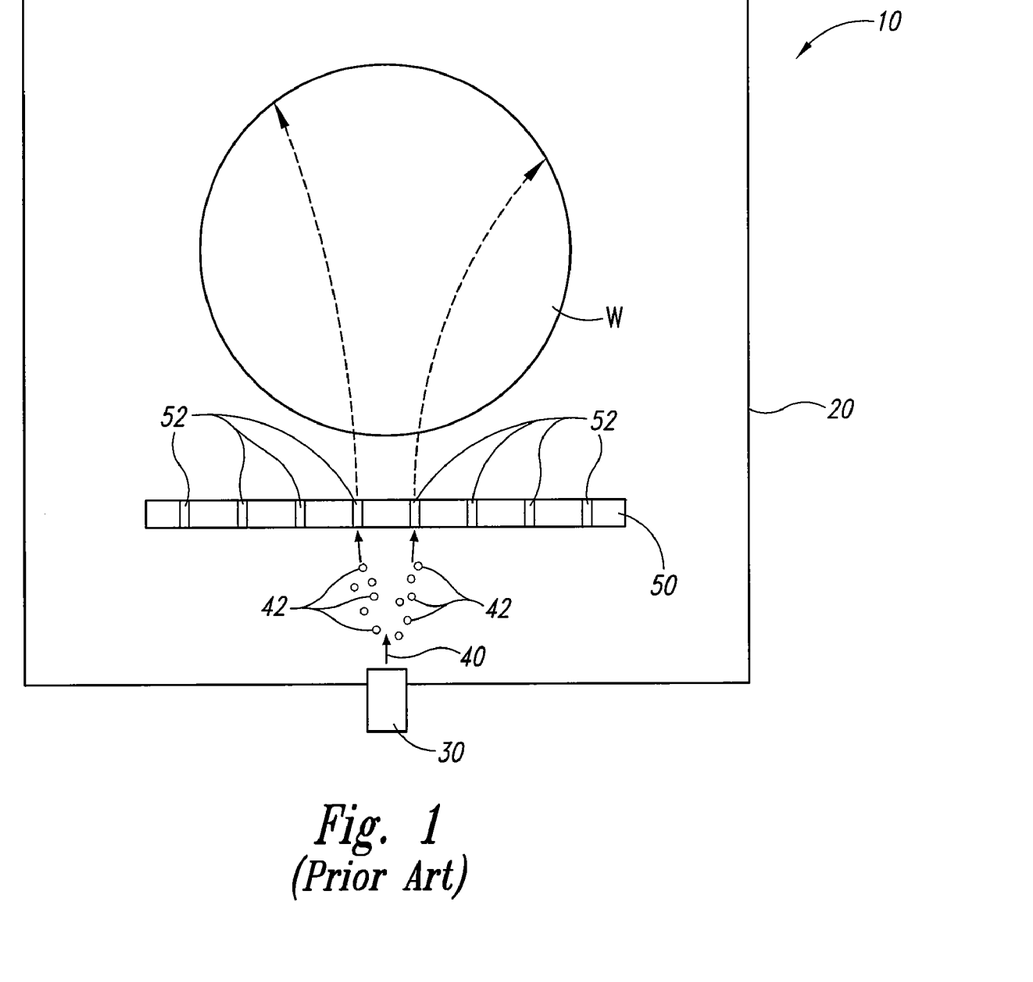
FIG. 1 is a schematic illustration of a conventional wet etching system in accordance with the prior art.

FIG. 1 schematically illustrates a conventional wet etching system 10 in which a microfeature workpiece W is immersed in a processing fluid within a tank 20. The system 10 can include a fluid inlet 30 at a lower portion of the tank 20 for providing a flow 40 of processing fluid. The system 10 can further include a diffuser plate 50 having a plurality of apertures 52 positioned between the inlet 30 and the workpiece W. The diffuser plate 50 creates a more uniform flow of processing fluid across the workpiece W.

One problem with the conventional system 10 is that bubbles 42 entrained in the flow of processing fluid pass across the workpiece W. The bubbles 42 are typically generated by an impeller (not shown) that pumps the processing fluid, but they can also be generated by other parts of the system 10. The bubbles 42 in the flow 40 of the processing fluid tend to collect on a bottom surface of the diffuser plate 50 and migrate toward the perimeter of the diffuser plate 50. As the bubbles 42 move laterally across the diffuser plate 50, several bubbles 42 pass through the apertures 52 and across the workpiece W. The bubbles 42 that pass across the workpiece W interrupt the chemical reaction between the processing fluid and the workpiece W. This generally causes streaking defects across the surface of the workpiece W and/or otherwise damages the workpiece W. Accordingly, there is a need to improve the wet etching process to mitigate the effects caused by bubbles in the flow of processing fluid.

DETAILED DESCRIPTION

A. Overview

Various embodiments of the present invention provide apparatuses and methods for processing microfeature workpieces. The term "microfeature workpiece" is used throughout to include substrates upon which and/or in which microelectronic devices, micromechanical devices, data storage elements, read/write components, and other devices are fabricated. For example, microfeature workpieces can be semiconductor wafers (e.g., silicon or gallium arsenide wafers), dielectric substrates (e.g., glass or ceramic), and many other types of materials. The microfeature workpieces typically have submicron features with dimensions of 0.05 micron or greater. Several embodiments in accordance with the invention are set forth in FIGS. 2-7 and the following text to provide a thorough understanding of particular embodiments of the invention. A person skilled in the art will understand, however, that the invention may have additional embodiments, or that the invention may be practiced without several of the details of the embodiments shown in FIGS. 2-7.

One embodiment of the invention provides a system for processing a microfeature workpiece. The system comprises a processing chamber having a workpiece processing site configured to receive a microfeature workpiece and a main inlet through which a processing fluid can flow into the processing chamber. The system further comprises a plate in the chamber between the main inlet and the workpiece processing site. The plate has a first side generally facing the main inlet and a second side opposite the first side. The plate further includes a plurality of passageways extending through the flow conditioning plate from the first side to the second side. The individual passageways include an inlet portion projecting from the first side of the plate by a separation distance.

The plate can have several different configurations. In one embodiment, for example, the first side of the plate has a V-shaped cross-sectional profile with upwardly inclined surfaces. The first side of the plate, however, can also be generally planar, arcuate and/or pyramidal. The inlet portions can also have various configurations. In several embodiments, for example, the inlet portions are raised features having cylindrical shapes. In other embodiments, however, the inlet portions can be conical or rectilinear.

Another aspect of the invention is directed toward methods of processing microfeature workpieces. One embodiment of such a method comprises positioning a microfeature workpiece in a processing chamber. The method continues by directing a processing fluid toward a diffuser plate in the chamber. The method further includes obstructing bubbles from passing through passageways in the diffuser plate before the processing fluid contacts the microfeature workpiece. In several embodiments, many bubbles are obstructed from passing through the passageways by blocking bubbles moving along an underside of the flow conditioning plate from entering inlet openings of the passageways. For example, individual passageways can include raised features projecting from the first side of the flow conditioning plate to space the inlet openings away from the plate in a manner that inhibits bubbles from entering the inlet openings.

B. Microfeature Workpiece Processing Systems

Figure 2:
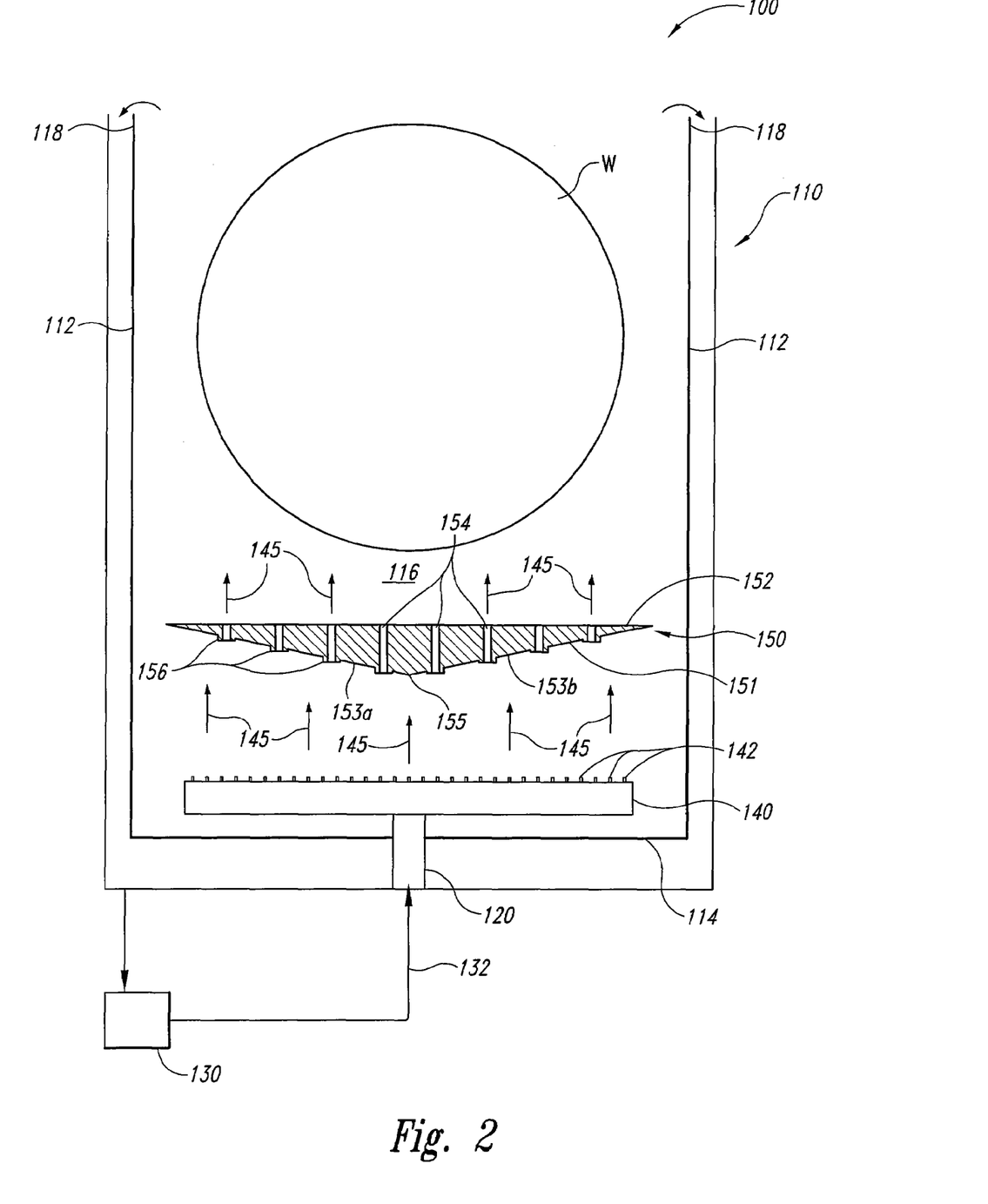
FIG. 2 is a partially schematic side cross-sectional view of a microfeature workpiece processing system in accordance with one embodiment of the invention.

FIG. 2 is a partially schematic side cross-sectional view of a microfeature workpiece processing system 100 in accordance with one embodiment of the invention. The system 100 generally includes a processing chamber 110, a fluid inlet 120 at a bottom portion of the chamber 110, and a conduit 140 coupled to the inlet 120. The system 100 also includes a pump 130 coupled to the inlet 120 via a fluid inlet line 132. The conduit 140 receives processing fluid from the inlet 120 and directs a flow of the processing fluid toward a workpiece W in the processing chamber 110. The system 100 also includes a plate 150 in the chamber 110 for conditioning the flow of processing fluid upstream from the workpiece W. As explained below, the plate 150 distributes the flow of processing fluid and inhibits bubbles from passing across the workpiece W.

The processing chamber 110 in the illustrated embodiment includes an inner vessel 112 having a bottom 114 that together define an interior 116 adapted to receive a processing fluid, e.g., a liquid etchant, for use in processing the workpiece W. The inner vessel 112 also includes an overflow opening 118, such as a weir, where the processing fluid exits the inner vessel 112. In operation, the pump 130 drives the processing fluid to the fluid inlet 120 via the inlet line 132. The processing fluid flows from the conduit 140 through a plurality of nozzles 142. The processing fluid then flows through or around the plate 150, past the workpiece W, and out via the overflow 118.

The flow conditioning plate 150 is positioned in the inner vessel 112 of the processing chamber 110 between the conduit 140 and the workpiece W. The plate 150 is generally transverse to a flow 145 of the processing fluid from the conduit 140. The plate 150 is made from a material that is chemically compatible with the processing fluid to be received in the interior 116 of the processing chamber 110.

The plate 150 in the illustrated embodiment includes a first side 151 generally facing the conduit 140 and a second side 152 opposite the first side 151. In the illustrated embodiment, the first side 151 has a first inclined section 153a and a second inclined section 153b that are angled upwardly from an apex 155. The plate 150 shown in FIG. 2 accordingly has a generally V-shaped cross-sectional profile. In other embodiments, however, the plate 150 may have other configurations. For example, the first side 151 can be a single, planar section inclined upwardly from one side of the chamber 110 to another side. The plate 150 also includes a plurality of passageways 154 (e.g., vias) through which the processing fluid can flow. The inclined sections 153a-b of the first side 151 and the passageways 154 modify the flow of processing fluid exiting the nozzles to provide a uniform flow moving upwardly to the workpiece W.

Figure 3A:
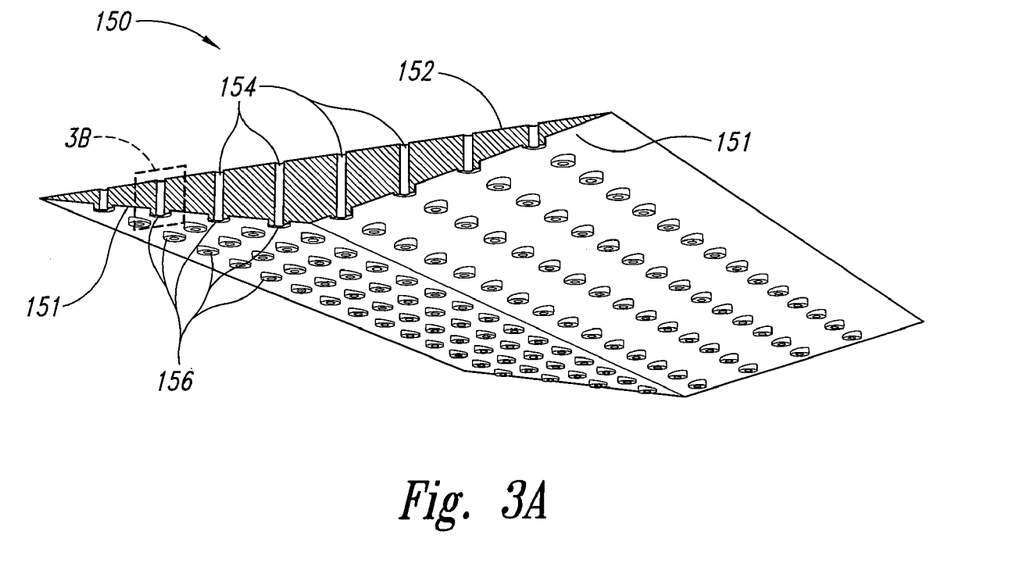
FIG. 3A is a cross-sectional bottom isometric view of a flow conditioning plate in the microfeature workpiece processing system of FIG. 2.
Figure 3B:
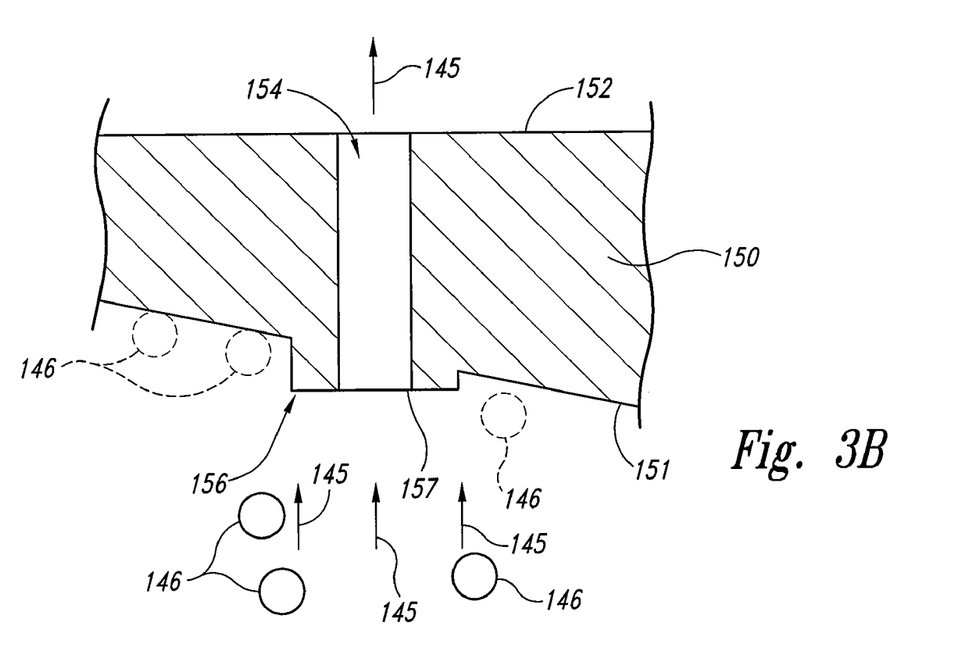
FIG. 3B is a side cross-sectional view illustrating specific details of a portion of the flow conditioning plate shown in FIG. 3A.

FIG. 3A is a cross-sectional bottom isometric view of the plate 150 and FIG. 3B is a side cross-sectional view of the area 3B shown in FIG. 3A. Referring to FIGS. 2-3B together, the passageways 154 extend from a point below the first side 151 of the plate 150 to the second side 152 of the plate 150. The passageways 154 are generally arranged in a matrix across the entire plate 150 to create a desired flow pattern of processing fluid for processing the workpiece W.

Individual passageways 154 include an inlet portion 156 projecting from the first side 151 of the plate 150 such that an opening 157 of the inlet portion 156 is upstream from the first side 151 of the plate 150 relative to the flow 145 of processing fluid. In the illustrated embodiment, the individual inlet portions 156 are protrusions formed integrally with the plate 150. In alternative embodiments, however, the individual inlet portions 156 may be discrete components aligned with corresponding passageways 154 and secured to the first side 151 of the flow conditioning plate 150 using a suitable adhesive or press fit into the passageways 154. The individual inlet portions 156 generally project from the first side 151 of the plate 150 by a distance greater than an expected bubble size within the system 100. For example, if bubbles as large as one-eighth of an inch are present in the system 100, the inlet portions 156 should project from the first side 151 of the plate 150 by one-eighth of an inch or more. In the illustrated embodiment, the individual inlet portions 156 are cylindrical protrusions. In other embodiments, however, the inlet portions 156 may be rectilinear, conical, or another suitable shape.

Referring to FIGS. 2 and 3B, a plurality of bubbles 146 (FIG. 3B) entrained in the flow 145 of processing fluid can impinge upon the first side 151 of the plate 150. In the conventional system illustrated above in FIG. 1, the bubbles 42 collected along the bottom of the diffuser plate 50 easily pass through the passageways 52 and cause streaks and/or defects on the workpiece W. Conversely, the plate 150 with the raised inlets 156 inhibits the bubbles 146 on the first side 151 of the plate 150 from passing through the passageways 154. More specifically, because the openings 157 of the inlet portions 156 are spaced apart from the first side 151 of the plate 150, the bubbles 146 flow upwardly and outwardly across the inclined sections 153a-b of the first side 151 without passing through the passageways 154. The bubbles 146 are accordingly obstructed from entering the inlet openings 157 and diverted toward an outboard edge of the plate 150 so that they pass through the interior 116 of the processing chamber 110 without contacting the workpiece W. Therefore, one advantage of the system 100 illustrated in FIGS. 2-3B is that the workpiece is exposed to fewer bubbles compared to conventional plates to reduce contamination and/or damage to the workpiece W.

Another feature of the flow conditioning plate 150 illustrated in FIGS. 2-3B is that the V-shaped profile of the inclined sections 153a-b at the first side 151 of the plate 150 directs bubbles 146 collected along first side 151 toward the perimeter of the plate 150. Accordingly, the bubbles 146 should not aggregate on the first side 151 of the plate 150 during the processing of the workpiece W, but rather the bubbles 146 should readily migrate upward and outward along the first side 151 of the plate 150.

C. Additional Embodiments of Flow Conditioning Plates

Figure 4A:
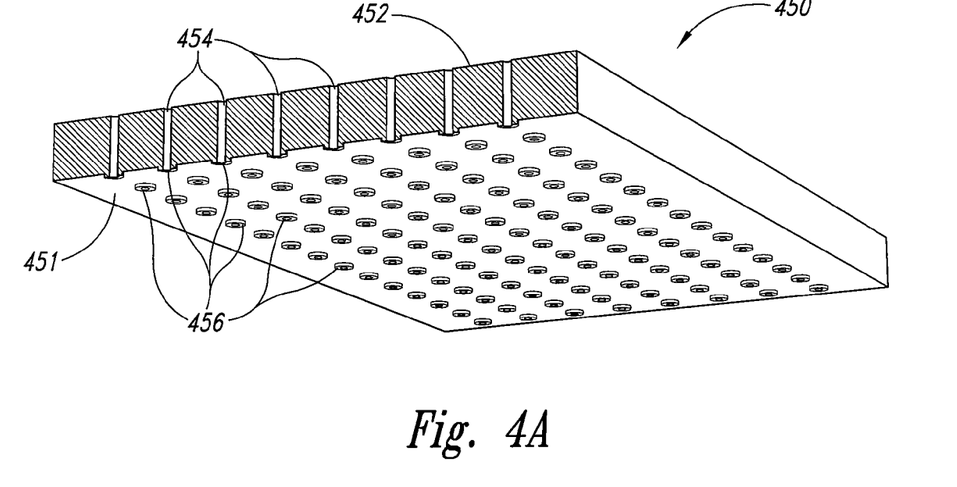
FIG. 4A is a cross-sectional bottom isometric view of a flow conditioning plate for use with the microfeature workpiece processing system of FIG. 2 in accordance with another embodiment of the invention.

FIGS. 4A-7 illustrate various configurations of flow conditioning plates in accordance with different embodiments of the invention. For example, FIG. 4A is a cross-sectional bottom isometric view of a plate 450 for use with the microfeature workpiece processing system 100 (FIG. 2). The plate 450 in this embodiment is generally planer rather than having the V-shaped cross-sectional profile of the plate 150 illustrated in FIGS. 2 and 3A. The plate 450 includes a first side 451 generally facing the conduit 140 (FIG. 2), and a second side 452 opposite the first side. The plate 450 further includes a plurality of passageways 454 extending from the first side 451 of the plate 450 to the second side 452 of the plate 450. Individual passageways 454 include an inlet portion 456 projecting from the first side 451 of the plate 450 toward the conduit 140 (FIG. 2). The inlet portions 456 are raised features that can have generally the same configuration as the inlet portions 156 described above with respect to FIGS. 2-3B.

Figure 4B:
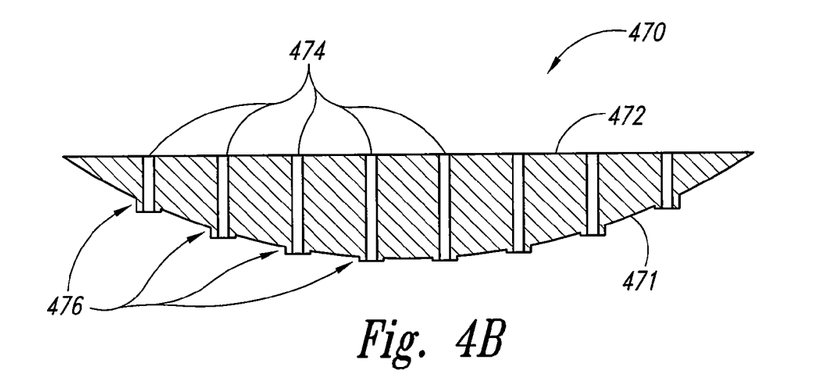
FIG. 4B is a side cross-sectional view of a flow conditioning plate for use with the microfeature workpiece processing system of FIG. 2 in accordance with yet another embodiment of the invention.

FIG. 4B is a side cross-sectional view of a plate 470 in accordance with another embodiment of the invention. The plate 470 includes a first side 471 and a second side 472 generally opposite the first side 471. The plate 470 shown in FIG. 4B differs from the plate 150 described above in that the first side 471 of the plate 470 is generally arcuate. For example, in the illustrated embodiment the first side 471 of the plate 470 has a generally semi-circular cross-sectional profile. In other embodiments, however, the first side 471 of the plate can be generally hemispherical, elliptical, a portion of a constant radius circle, and/or otherwise curved. The plate 470 further includes a plurality of passageways 474 extending from the first side 471 to the second side 472 of the plate 470. The individual passageways 474 include an inlet portion 476 generally similar to the inlet portions 156 described above with respect to FIGS. 2-3B.

Figure 5:
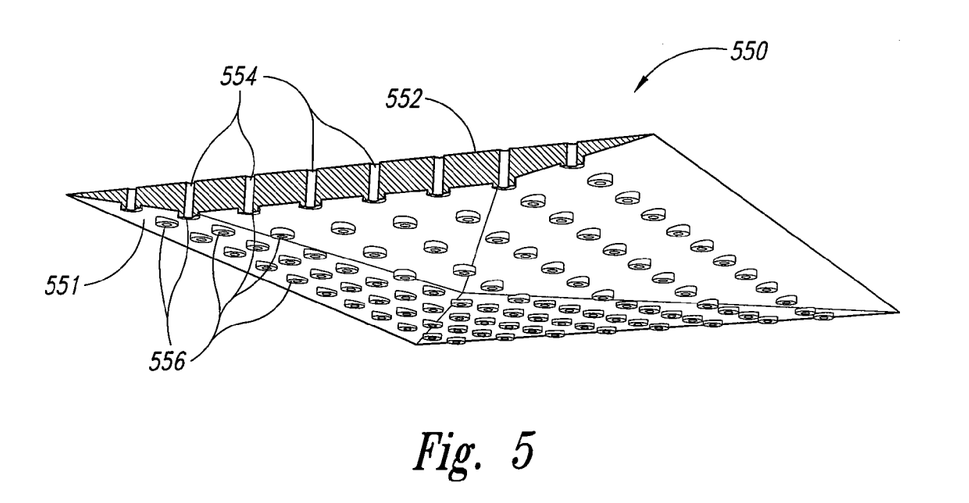
FIG. 5 is a cross-sectional bottom isometric view of a flow conditioning plate for use with the microfeature workpiece processing system of FIG. 2 in accordance with yet another embodiment of the invention.

FIG. 5 is a cross-sectional bottom isometric view of a plate 550 for use with the microfeature workpiece processing system 100 (FIG. 2) in accordance with yet another embodiment of the invention. The plate 550 includes a first side 551 and a second side 552 generally opposite the first side 551. The plate 550 in the illustrated embodiment differs from the plate 150 described above with respect to FIG. 2 in that the first side 551 of the plate 550 has a generally pyramidal shape, as opposed to the V-shaped cross-sectional profile of the plate 150. The plate 550 includes a plurality of passageways 554 extending from the first side 551 to the second side 552 of the plate 550. The individual passageways 554 include an inlet portion 556 generally similar to the inlet portions 156 described above with respect to FIGS. 2-3B.

Figure 6:
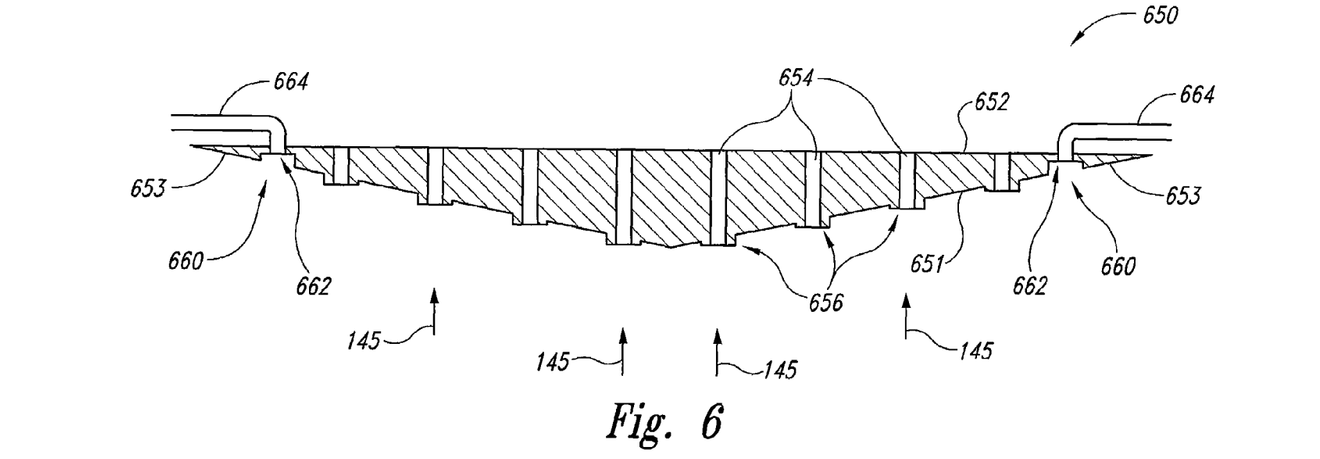
FIG. 6 is a side cross-sectional view of a flow conditioning plate for use with the microfeature workpiece processing system of FIG. 2 in accordance with yet another embodiment of the invention.

FIG. 6 is a side cross-sectional view of a plate 650 in accordance with yet another embodiment of the invention. The plate 650 can include a first side 651 generally facing the conduit 140 (FIG. 2) and a second side 652 opposite the first side 651. The plate 650 further includes a plurality of passageways 654 extending from the first side 651 to the second side 652 of the plate 650. The individual passageways 654 include an inlet portion 656 projecting from the first side 651 of the plate 650 in a direction opposite to the second side 652. The primary difference between the plate 650 in FIG. 6 and the plate 150 illustrated in FIGS. 2-3B is that the plate 650 includes a bubble removal system 660 at an outboard edge 653 of the plate 650.

The bubble removal system 660 in the embodiment illustrated in FIG. 6 includes an entrapment portion 662 at each outboard edge 653 of the plate 650. The entrapment portion 662 is generally a cavity, such as an elongated trench, extending along the outboard edge 653 of the plate 650. The entrapment portion 662 may have other configurations or be positioned at other locations on the plate 650 in other embodiments. The bubble removal system 660 further includes a vent line 664 in fluid communication with the entrapment portion 662. In operation, bubbles move across the first side 651 of the plate 650 toward the outboard edge 653. The entrapment portion 662 catches the bubbles, and the vent line 664 transports the bubbles out of the processing chamber 110 (FIG. 2). One advantage of the plate 650 in the embodiment illustrated in FIG. 6 is that bubbles will not build up in the processing fluid because the plate 650 removes bubbles from the system.

Figure 7:
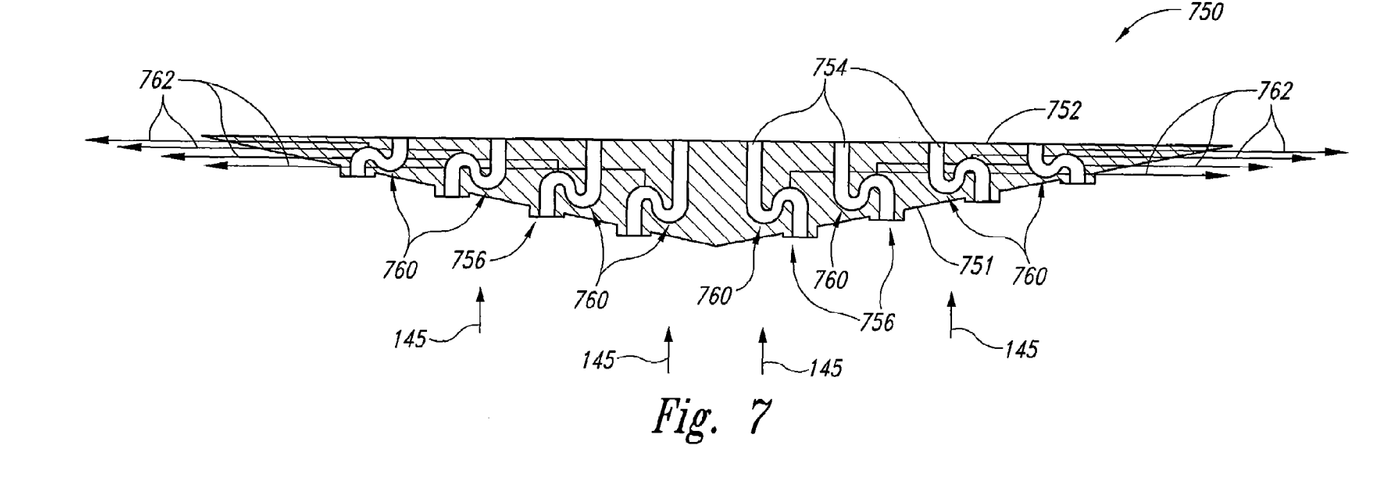
FIG. 7 is a side cross-sectional view of a flow conditioning plate for use with the microfeature workpiece processing system of FIG. 2 in accordance with still another embodiment of the invention.

FIG. 7 is a side cross-sectional view of a plate 750 for conditioning the flow in accordance with yet another embodiment of the invention. The plate 750 can include a first side 751 generally facing the conduit 140 (FIG. 2) and a second side 752 opposite the first side 751. The plate 750 can further include a plurality of passageways 754 extending from the first side 751 to the second side 752. The individual passageways 754 can include an inlet portion 756 projecting from the first side 751 of the plate 750. The primary difference between the plate 750 shown in FIG. 7 and the plate 150 illustrated in FIGS. 2-3B is that individual passageways 754 in the plate 750 also include bubble traps 760. In the illustrated embodiment, for example, the bubble traps 760 are generally U-shaped traps configured to capture bubbles (not shown) traveling through the passageways 754. In alternative embodiments, the bubble traps 760 may have other shapes and/or configurations.

One advantage of the bubble traps 760 in the illustrated embodiment is that they further mitigate possible contamination of the workpiece W by trapping any bubbles (not shown) that may inadvertently pass through the passageways 754. Referring to FIG. 2, for example, the majority of bubbles 146 (FIG. 2) in the flow 145 are diverted along the first side 151 of the plate 150 (FIG. 2); nonetheless, bubbles substantially aligned with an individual passageway 154 (FIG. 2) can pass through the corresponding passageway and possibly contact the workpiece W (FIG. 2). The bubble traps 760, however, prevent the bubbles (not shown) passing through the passageways 754 from contacting and/or contaminating the workpiece W.

In a further aspect of this embodiment, a plurality of vent lines 762 coupled to the bubble traps 760 carry bubbles (not shown) out of the individual passageways 754 and away from the workpiece W. For example, in the embodiment shown in FIG. 7 the vent lines 762 transport bubbles (not shown) entirely out of the processing chamber 110 (FIG. 2). In other embodiments, the vent lines 762 may direct trapped bubbles to another location within the system 100. Additionally, in still another alternative embodiment, the plate 750 can also include the bubble removal system shown in FIG. 6.

From the foregoing, it will be appreciated that specific embodiments of the invention have been described herein for purposes of illustration, but that various modifications may be made without deviating from the spirit and scope of the invention. For example, various aspects of any of the foregoing embodiments can be combined in different combinations. Additionally, a second plate having a pattern of holes can be positioned between the inlet and any of the diverting plates described above with reference to FIGS. 2-7 such that the holes in the second plate are laterally offset from the holes in the diverting plates. This arrangement directs bubbles passing through the holes in the second plate to the inclined surface of the diverting plate such that bubbles are less likely to pass directly through one of the holes in the diverting plate. Accordingly, the invention is not limited except as by the appended claims.

I claim:

1. A method of processing a microfeature workpiece, comprising:
    positioning a microfeature workpiece in a processing chamber;
    directing a processing fluid toward a diffuser plate in the chamber; and
    obstructing bubbles from passing through passageways in the diffuser plate before the processing fluid contacts the microfeature workpiece, wherein obstructing bubbles from passing through passageways in the diffuser plate comprises flowing the processing fluid through the passageways in the diffuser plate, the individual passageways being aligned with at least a portion of the workpiece, and wherein each passageway includes a raised feature projecting upstream in the flow of processing fluid relative to a first side of the plate and an inlet orifice at an upstream end of the raised feature to prevent bubbles from entering the corresponding passageway.

2. The method of claim 1 wherein:
    directing a processing fluid toward a diffuser plate comprises flowing the processing fluid through a conduit including a fluid passageway having a section aligned with at least a portion of the workpiece and a plurality of nozzles along the section adapted to deliver the processing fluid to the workpiece.

3. The method of claim 1 wherein the passageways further comprise bubble traps between the first side and a second side of the diffuser plate to capture bubbles passing through the passageways.

4. The method of claim 1 wherein obstructing bubbles from passing through passageways in the diffuser plate comprises positioning the diffuser plate upstream in the flow of processing fluid relative to the workpiece.

5. The method of claim 1, further comprising removing the obstructed bubbles from the processing chamber.

6. The method of claim 1, further comprising removing the obstructed bubbles from the processing chamber through a vent line operably coupled to a cavity at an outboard edge of the diffuser plate.

7. The method of claim 1, further comprising contacting a surface of the microfeature workpiece with the processing fluid.

8. A method of processing a microfeature workpiece, comprising:
    positioning a microfeature workpiece in a processing chamber;
    delivering a processing fluid to the chamber through a main inlet to form a flow of processing fluid directed to a flow conditioning plate having individual passageways aligned with at least a portion of the workpiece; and
    preventing bubbles from passing through the passageways in the flow conditioning plate by spacing inlet orifices of each passageway apart from an inclined bottom surface of the flow conditioning plate.

9. The method of claim 8 wherein delivering a processing fluid to the chamber through a main inlet comprises flowing the processing fluid through a conduit including a fluid passageway having a plurality of nozzles adapted to deliver the processing fluid to the chamber.

10. The method of claim 8 wherein preventing bubbles from passing through the passageways in the flow conditioning plate further comprises positioning the flow conditioning plate generally transverse to the flow of processing fluid in the chamber.

11. The method of claim 8 wherein preventing bubbles from passing through the passageways in the flow conditioning plate comprises flowing the processing fluid through the passageways extending through the flow conditioning plate, and wherein the individual passageways further comprise a U-shaped trap between the first side and a second side of flow conditioning plate to capture bubbles passing through the passageways.

12. The method of claim 8, further comprising removing the bubbles from the processing chamber.

13. The method of claim 8, further comprising removing the bubbles from the processing chamber through a vent line operably coupled to a cavity at an outboard edge of the flow conditioning plate, wherein the cavity is configured to trap bubbles moving along the first side of the flow conditioning plate.

14. The method of claim 8, further comprising contacting a surface of the microfeature workpiece with the processing fluid.

15. A method of processing a microfeature workpiece, comprising:
    positioning a microfeature workpiece in a processing chamber;
    positioning a flow diffuser plate in the processing chamber between the workpiece and a conduit having a plurality of nozzles aligned with at least a portion of the workpiece, the flow diffuser plate having a first side with a generally V-shaped cross-sectional profile generally facing the conduit, a second side opposite the first side, and a plurality of passageways extending through the plate;
    delivering a processing fluid to the interior of the chamber through the plurality of nozzles aligned with at least a portion of the workpiece; and
    inhibiting bubbles from passing through passageways in the flow diffuser plate by flowing the processing fluid through the plurality of passageways extending through the plate, the individual passageways being aligned with at least a portion of the workpiece, and wherein each passageway includes an inlet portion projecting upstream in the flow of processing fluid relative to the first side of the flow diffuser plate and an inlet orifice at an upstream end of the inlet portion.

16. The method of claim 15 wherein:
    the individual passageways further comprise a U-shaped trap between the first side and the second side of the flow diffuser plate; and
    inhibiting bubbles from passing through passageways in the flow diffuser plate comprises flowing the processing fluid through the passageways, and wherein the U-shaped traps are positioned to capture bubbles passing through the passageways.

17. The method of claim 15, further comprising removing the bubbles from the processing chamber.

18. The method of claim 15, further comprising removing the bubbles from the processing chamber through a vent line operably coupled to a cavity at an outboard edge of the flow diffuser plate.

19. A method of processing a workpiece, comprising:
    positioning a workpiece in a processing chamber;
    directing a processing fluid toward a diffuser plate in the chamber; and obstructing bubbles from passing through passageways in the diffuser plate before the processing fluid contacts the workpiece, the individual passageways being aligned with at least a portion of the workpiece, and wherein each passageway includes an inlet portion projecting upstream in the flow of processing fluid relative to a first side of the diffuser plate and an inlet orifice at an upstream end of the inlet portion.

* * * * *